(12) United States Patent
Choi et al.

(10) Patent No.: US 7,791,125 B2
(45) Date of Patent: Sep. 7, 2010

(54) SEMICONDUCTOR DEVICES HAVING DIELECTRIC LAYERS AND METHODS OF FORMING THE SAME

(75) Inventors: Hoon-Sang Choi, Seoul (KR); Jong-Cheol Lee, Seoul (KR); Ki-Vin Im, Gyeonggi-do (KR); Jae-Hyun Yeo, Gyeonggi-do (KR); Eun-Ae Chung, Seoul (KR); Sang-Yeol Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 11/881,562

(22) Filed: Jul. 27, 2007

(65) Prior Publication Data

US 2008/0023746 A1 Jan. 31, 2008

(30) Foreign Application Priority Data

Jul. 31, 2006 (KR) .................. 10-2006-0072206

(51) Int. Cl.
*H01L 27/108* (2006.01)

(52) U.S. Cl. .................. 257/310; 257/E21.009; 438/104

(58) Field of Classification Search .................. 257/310, 257/E21.009; 438/104
See application file for complete search history.

(56) References Cited

U.S. PATENT DOCUMENTS 6,740,605 B1* 5/2004 Shiraiwa et al. ............. 438/795
2005/0122005 A1* 6/2005 Higuchi et al. .............. 310/363

FOREIGN PATENT DOCUMENTS

| JP | 2003218107 | 7/2003 |
| KR | 1020060057037 | 5/2006 |
| KR | 1020060059454 | 6/2006 |

\* cited by examiner

*Primary Examiner*—Thao X Le
*Assistant Examiner*—Matthew Gordon
(74) *Attorney, Agent, or Firm*—Myers Bigel Sibley & Sajovec

(57) ABSTRACT

A method of forming a semiconductor device includes loading a semiconductor substrate into a reaction chamber, and providing metal organic precursors including hafnium and zirconium into the reaction chamber to form hafnium-zirconium oxide ($Hf_xZr_{1-x}O$; $0<X<1$) with a tetragonal crystalline structure on the semiconductor substrate. Related structures are also discussed.

7 Claims, 8 Drawing Sheets

US 7,791,125 B2

SEMICONDUCTOR DEVICES HAVING DIELECTRIC LAYERS AND METHODS OF FORMING THE SAME

CROSS-REFERENCE TO RELATED APPLICATION AND CLAIM OF PRIORITY

This U.S. non-provisional patent application claims priority under 35 U.S.C § 119 to Korean Patent Application 2006-72206 filed on Jul. 31, 2006, the disclosure of which is hereby incorporated by reference.

BACKGROUND

The present invention relates to semiconductor devices and, more specifically, to methods of forming semiconductor devices having dielectric layers.

As semiconductor devices are moving toward higher integration density, it is desirable for a capacitor of a DRAM device to have higher capacitance per unit area. A variety of approaches have been employed to increase capacitance. The approaches include reducing the thickness of the dielectric layer, increasing surface areas of top and bottom electrodes, and using a dielectric layer having a high dielectric constant. However, increasing surface areas of top and bottom electrodes is physically limited, and reducing the thickness of a capacitor dielectric layer may result in increased leakage current due to tunneling. High-k dielectric layers are being developed to decrease leakage current. It may be desirable for a high-k dielectric layer of a capacitor for use in a highly integrated semiconductor device to have an equivalent oxide thickness of approximately 6 angstroms.

Zirconium oxide ($ZrO_2$) having a tetragonal crystalline structure has been considered as a high-k dielectric layer for use in capacitors of semiconductor devices. The dielectric constant of zirconium oxide is about 40. Zirconium oxide exhibits a satisfactory leakage current characteristic under an equivalent oxide thickness of 8 angstroms but may not be suitable for use with an equivalent oxide thickness of 8 angstroms, because of increased leakage current. On the other hand, hafnium oxide ($HfO_2$) having a tetragonal crystalline structure exhibits a similar leakage current characteristic compared to zirconium oxide, and has a dielectric constant of about 70. However, at deposition temperatures of 300 degrees centigrade or lower, monoclinic hafnium oxide is formed. Thus, it may be difficult to form tetragonal hafnium oxide.

SUMMARY

Methods of forming a semiconductor device according to some embodiments of the invention include loading a semiconductor substrate into a reaction chamber, providing metal organic precursors including hafnium and zirconium into the reaction chamber, and forming a layer of hafnium-zirconium oxide ($Hf_xZr_{1-x}O$, $0<X<1$) having a tetragonal crystalline structure on the semiconductor substrate.

The methods may further include performing a rapid thermal annealing process on the semiconductor substrate after forming the hafnium-zirconium oxide ($Hf_xZr_{1-x}O$, $0<X<1$) layer. The rapid thermal annealing process may be performed at a temperature ranging from about 500 to about 700 degrees centigrade.

The methods may further include reoxidizing the hafnium-zirconium oxide ($Hf_xZr_{1-x}O$, $0<X<1$) layer after performing the rapid thermal annealing process.

Forming the hafnium-zirconium oxide ($Hf_xZr_{1-x}O$, $0<x<1$) layer may include reacting the metal organic precursors including hafnium and zirconium with an oxidizer.

The metal organic precursors may include tetrakis-ethyl-methyl-amino-hafnium [$Hf(N(CH_3)(C_2H_5))_4$] and tetrakis-ethyl-methyl-amino-zirconium [$Zr(N(CH_3)(C_2H_5))_4$]. A mole ratio of the tetrakis-ethyl-methyl-amino-zirconium [$Zr(N(CH_3)(C_2H_5))_4$] to the tetrakis-ethyl-methyl-amino-hafnium [$Hf(N(CH_3)(C_2H_5))_4$] may be 1 or higher.

In some embodiments, the hafnium mole fraction (X) of the hafnium-zirconium oxide ($Hf_xZr_{1-x}O$) layer may be 0.5 or less.

The semiconductor substrate may include a bottom electrode, and the hafnium-zirconium oxide ($Hf_xZr_{1-x}O$, $0<X<1$) layer having a tetragonal crystalline structure may be formed on the bottom electrode. The methods may further include forming a top electrode on the hafnium-zirconium oxide ($Hf_xZr_{1-x}O$, $0<X<1$) layer.

A semiconductor device according to some embodiments of the invention may include a semiconductor substrate having a conductive region, a hafnium-zirconium oxide ($Hf_xZr_{1-x}O$, $0<X<1$) layer having a tetragonal crystalline structure on the conductive region, and a conductive layer on the hafnium-zirconium oxide ($Hf_xZr_{1-x}O$, $0<X<1$) layer. In some embodiments, the hafnium mole fraction (X) of the hafnium-zirconium oxide ($Hf_xZr_{1-x}O$) layer may be 0.5 or less.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Some embodiments according to the present invention relate to hafnium-zirconium oxide and, more specifically, to cases in which hafnium-zirconium oxide is used in a capacitor dielectric layer. Hafnium-zirconium oxide may be used in a capacitor dielectric layer, as well as a variety of insulation layers for use in semiconductor devices.

Figure 1:
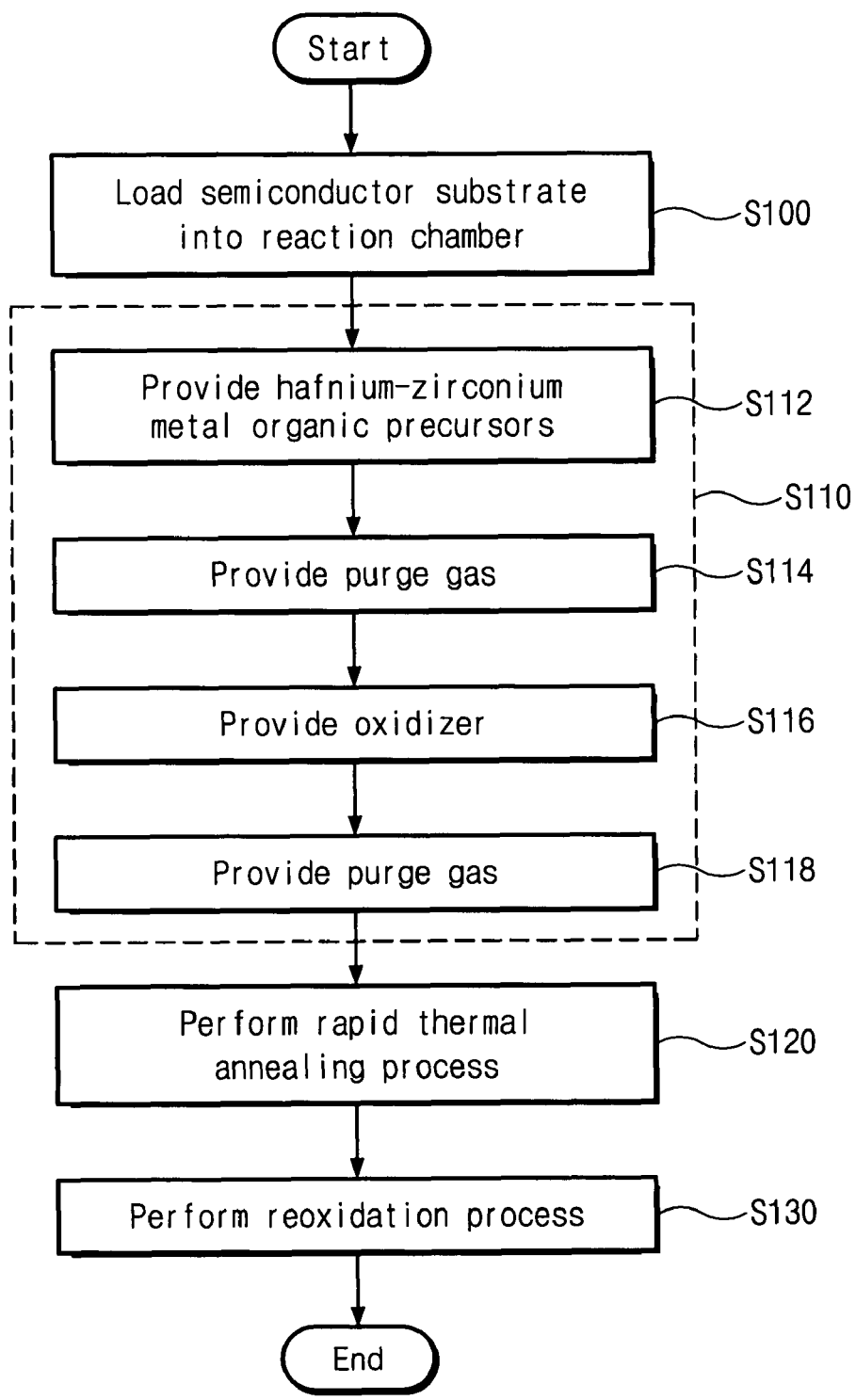
FIG. 1 is a flowchart illustrating a method for forming a dielectric layer of a semiconductor device according to some embodiments of the present invention.

FIG. 1 is a cross-sectional view illustrating methods of forming a dielectric layer of a semiconductor device according to embodiments of the present invention.

Referring to FIG. 1, a semiconductor substrate is loaded into a reaction chamber (S100). Hafnium-zirconium precursors are supplied into the reaction chamber (S112). The hafnium-zirconium precursors may include, for example, tetrakis-ethyl-methyl-amino-hafnium $[Hf(N(CH_3)(C_2H_5))_4]$ and tetrakis-ethyl-methyl-amino-zirconium $[Zr(N(CH_3)(C_2H_5))_4]$. A mole ratio of $[Zr(N(CH_3)(C_2H_5))_4]$ to $[Hf(N(CH_3)(C_2H_5))_4]$ may be 1 or higher. The hafnium-zirconium precursors are attached onto the semiconductor substrate. Unattached precursors may be removed by a purge gas (S114). An oxidizer (such as $O_3$) is supplied into the reaction chamber (S116). The oxidizer reacts with the hafnium-zirconium precursor to form hafnium-zirconium oxide ($Hf_xZr_{1-x}O$; $0<X<1$). When the hafnium mole fraction (X) of $Hf_xZr_{1-x}O$ is 0.5 or less, the hafnium-zirconium oxide may have a tetragonal crystalline structure. Purge gas is supplied into the reaction chamber to remove reactive byproducts (S118). The purge gas may include an inert gas, such as argon (Ar) gas. The steps of providing Hf, Zr precursors (S112), supplying purge gas (S114), providing an oxidizer (S116), and providing purge gas (S118) may be repeated as one cycle (S110).

A rapid thermal annealing process is performed on the hafnium-zirconium oxide ($Hf_xZr_{1-x}O$; $0<X<1$) formed on the semiconductor substrate (S120). Thus, hafnium-zirconium oxide ($Hf_xZr_{1-x}O$; $0<X<1$) may be crystallized to have a size ranging from 30 to 100 angstroms. The rapid thermal annealing process may be performed at a temperature ranging from 500 to 700 degrees centigrade. The rapid thermal anneal process may be performed, for example, in a rapid thermal anneal chamber that is different from the reaction chamber. After performing the rapid thermal annealing process, the hafnium-zirconium oxide ($Hf_xZr_{1-x}O$; $0<X<1$) may be reoxidized (S130). The reoxidation of the hafnium-zirconium oxide ($Hf_xZr_{1-x}O$; $0<X<1$) may be done to remove contaminants therein and/or to compensate oxygen deficiency. The conditions for the reoxidation may vary with the ratio of $[Hf(N(CH_3)(C_2H_5))_4]$ and $[Zr(N(CH_3)(C_2H_5))_4]$. For example, in the case where a plasma of oxygen gas and nitrogen gas is used, a reoxidation of the hafnium-zirconium oxide may be done under the following conditions: pressure of about 1 to 200 Pa, RF power of about 200-500 W, temperature of about 100 to 400° C., and process time of about 1 to 30 minutes. The hafnium-zirconium oxide ($Hf_xZr_{1-x}O$; $0<X<1$) with the tetragonal crystalline structure formed through a process as described above may have a high dielectric constant.

Figure 2:
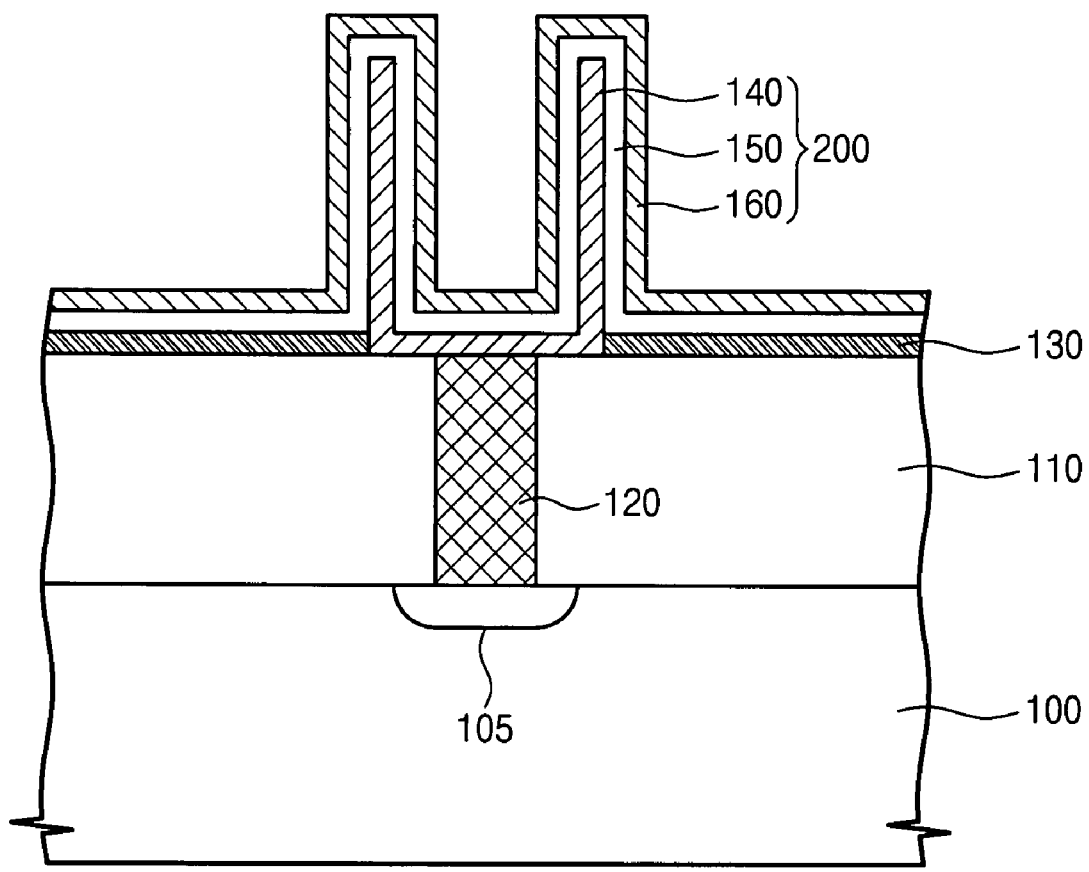
FIG. 2 is a cross-sectional view of a capacitor of a semiconductor device according to some embodiments of the present invention.

FIG. 2 is a cross-sectional view of a capacitor of a semiconductor device according to some embodiments of the present invention.

Referring to FIG. 2, an interlayer dielectric 110 is provided on a semiconductor substrate 100 having a conductive region 105, such as a source/drain region of a memory cell access transistor. A contact plug 120 is provided in the interlayer dielectric 110 and contacts the conductive region 105. The conductive region 105 may, for example, be a source region. An etch-stop layer 130 may be provided on the interlayer dielectric 110. The etch-stop layer 130 may include silicon nitride and/or silicon oxynitride. A cylindrical bottom electrode 140 is provided on the interlayer dielectric 110 and contacts the contact plug 120. The bottom electrode 140 may be formed from a material, such as titanium, titanium nitride, and/or titanium oxynitride. A hafnium-zirconium oxide ($Hf_xZr_{1-x}O$; $0<X<1$) layer 150 having a tetragonal crystalline structure is provided on the bottom electrode 140 and the etch-stop layer 130. When X of the $Hf_xZr_{1-x}O$ is 0.5, the hafnium-zirconium oxide may have the highest dielectric constant. A top electrode 160 is provided on the hafnium-zirconium oxide layer 150. The bottom electrode 140, the hafnium-zirconium oxide layer 150, and the top electrode 160 form a capacitor 200. Due to the provision of a hafnium-zirconium oxide dielectric layer, the capacitor 200 may have a high dielectric constant and/or a high capacitance.

Figure 3A:
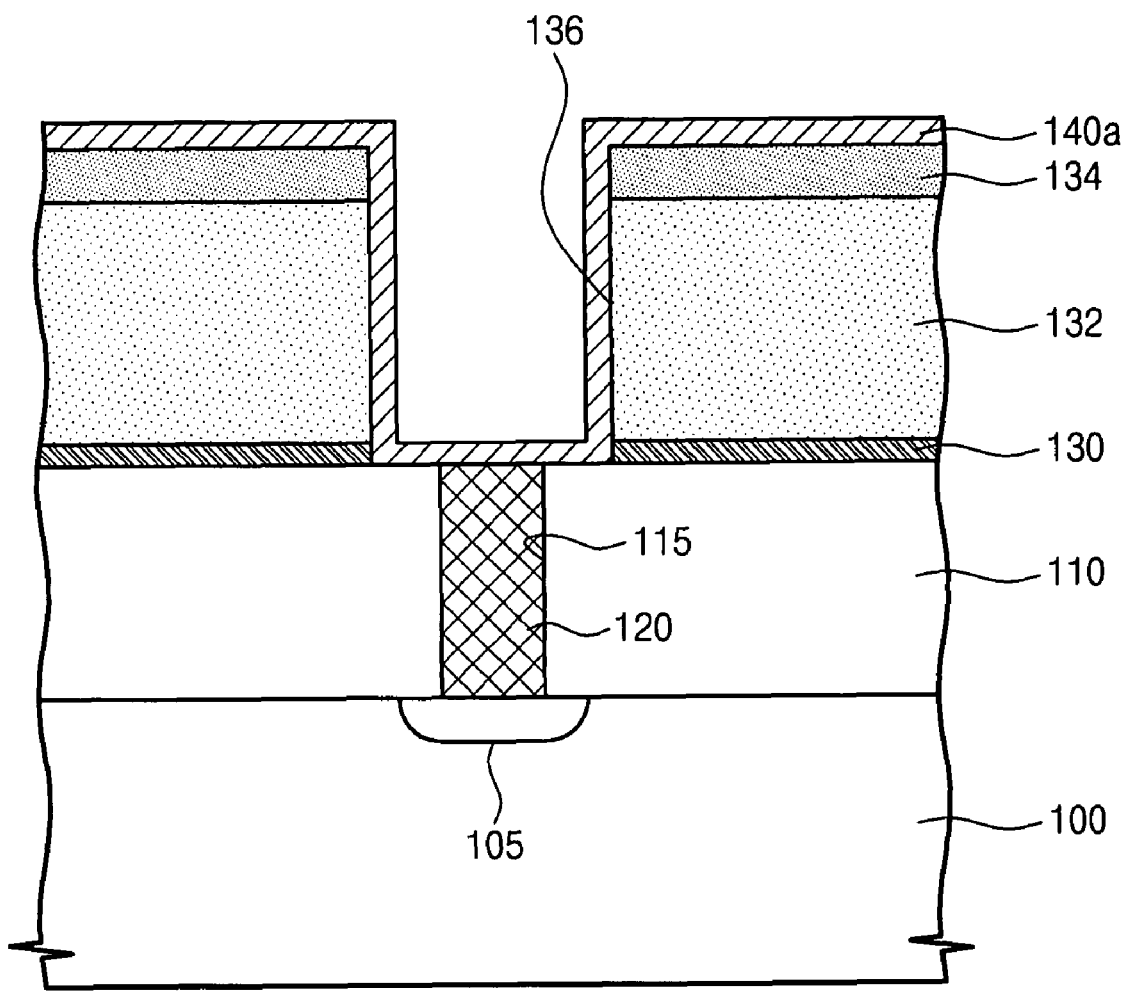
FIGS. 3A through 3C are cross-sectional views illustrating a method for forming a capacitor of a semiconductor device according to some embodiments of the present invention.
Figure 3B:
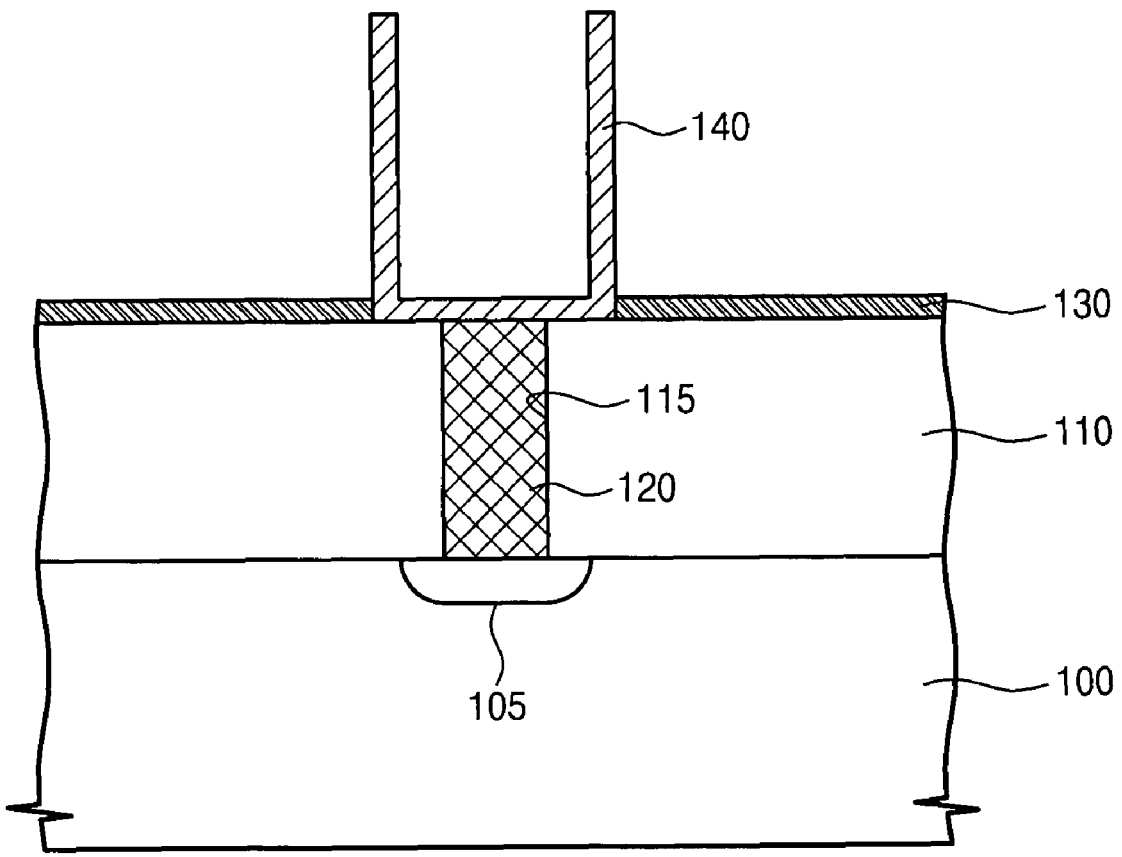
Figure 3C:
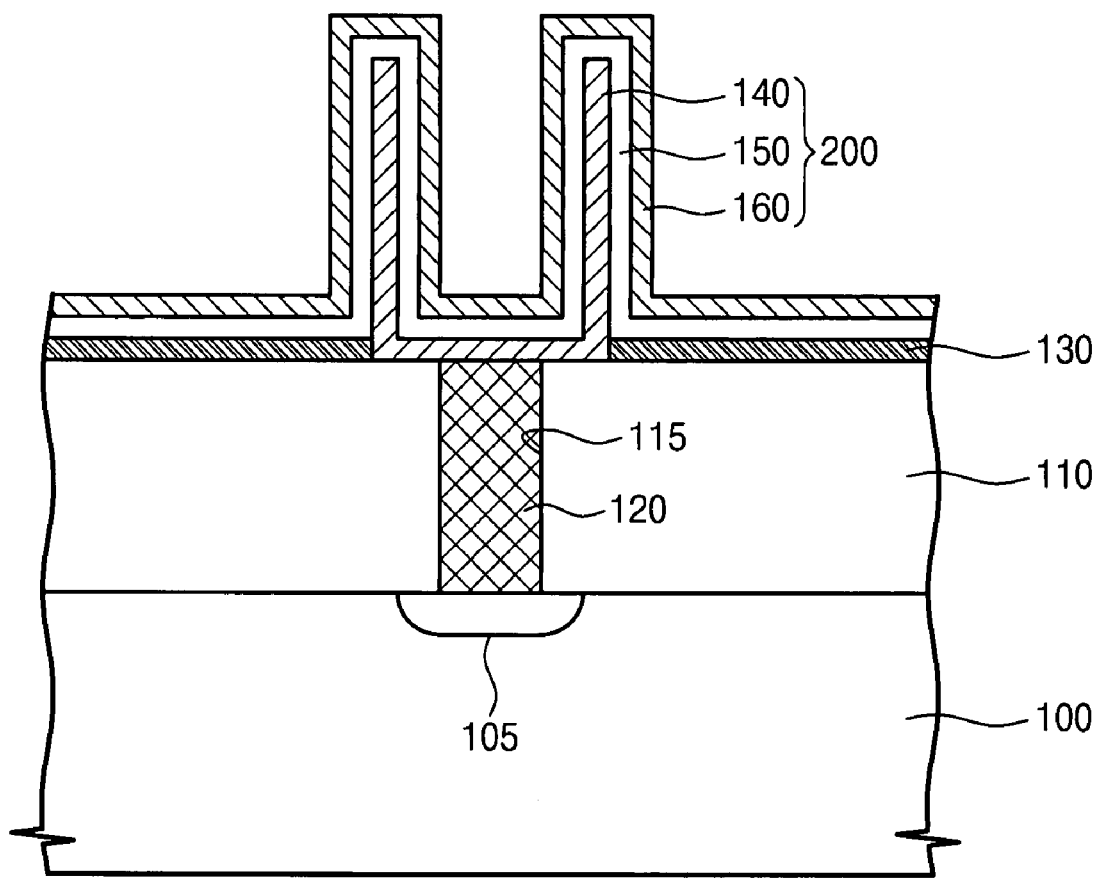

FIGS. 3A through 3C are cross-sectional views illustrating methods of forming capacitors of semiconductor devices according to some embodiments of the present invention.

Referring to FIG. 3A, a conductive region 105 is formed in a semiconductor substrate 100. The conductive region 105 may be a source/drain region of a transistor (such as a memory cell access transistor), and may be formed using an ion implanting process. An interlayer dielectric 110 is formed on the semiconductor substrate 100. The formation of the interlayer dielectric 110 may be done using a chemical vapor deposition process, a spin-on-glass process, or the like. A contact plug 120 is formed in the interlayer dielectric 110. The contact plug 120 may be formed using a planarization process after forming a contact hole 115 in the interlayer dielectric 115 and depositing a conductive material in the contact hole 115. An etch-stop layer 130, a mold oxide layer 132, and a hard mask layer 134 are sequentially formed on the interlayer dielectric 110 and the contact plug 120. The etch-stop layer 130 may include a silicon nitride layer and/or a silicon oxynitride layer, and may be formed, for example, using a chemical vapor deposition process. The mold oxide layer 132 may be formed using a chemical vapor deposition process, a spin-on-glass process, or the like. The hard mask layer 134 may include a silicon nitride layer and/or a silicon oxynitride layer, and may be formed, for example, using a chemical vapor deposition process.

The hard mask layer 134 is patterned using a photoresist pattern (not shown) to form a hard mask pattern 134. Using the hard mask pattern 134 as a mask, a cylindrical opening 136 is formed in the mold oxide layer 132 and the etch-stop layer 130. A bottom electrode layer 140a is formed on a bottom surface and on side surfaces of the opening 136. The bottom electrode layer 140a may be formed using a physical vapor deposition process and/or a chemical vapor deposition process. The bottom electrode layer 140a may include titanium, titanium nitride, and/or titanium oxynitride, for example.

Referring to FIGS. 3A and 3B, a sacrificial oxide layer (not shown) is formed on the bottom electrode layer 140a to fill the opening 136. A planarization process is performed to expose the mold oxide layer 132. The sacrificial oxide layer and the mold oxide layer 132 are removed using a wet etch process to form a cylindrical bottom electrode 140. The wet etch process may use a solution including hydrofluoric acid (HF).

Referring to FIG. 3C, a hafnium-zirconium oxide ($Hf_xZr_{1-x}O$; 0<X<1) layer 150 having a tetragonal crystalline structure is formed on the bottom electrode 140 and on the etch-stop layer 130. As described with reference to FIG. 1, the formation of the hafnium-zirconium oxide layer 150 may include loading a semiconductor substrate having the bottom electrode 140 into a reaction chamber, providing hafnium-zirconium precursors into the reaction chamber, and reacting an oxidizer provided into the reaction chamber to the hafnium-zirconium precursors. After forming the hafnium-zirconium oxide 150, a rapid thermal annealing process may be performed at a temperature ranging from about 500 to about 700 degrees centigrade. After performing the rapid thermal annealing process, a reoxidation process may additionally be performed to remove contaminants and/or to compensate oxygen deficiency.

A top electrode 160 is formed on the hafnium-zirconium oxide layer 150. The top electrode 160 may be formed, for example, using a chemical vapor deposition process and/or a physical vapor deposition process, for example. The top electrode 160 may include a material such as titanium nitride, polysilicon, and/or tungsten. Thus a capacitor 200 is formed, which includes the bottom electrode 140, the hafnium-zirconium oxide layer 150, and the top electrode 160. Due to the use of the hafnium-zirconium oxide layer 150 as a capacitor dielectric layer, the capacitor 200 may have a high dielectric constant and/or high capacitance, and/or may exhibit enhanced leakage current characteristics.

Figure 4:
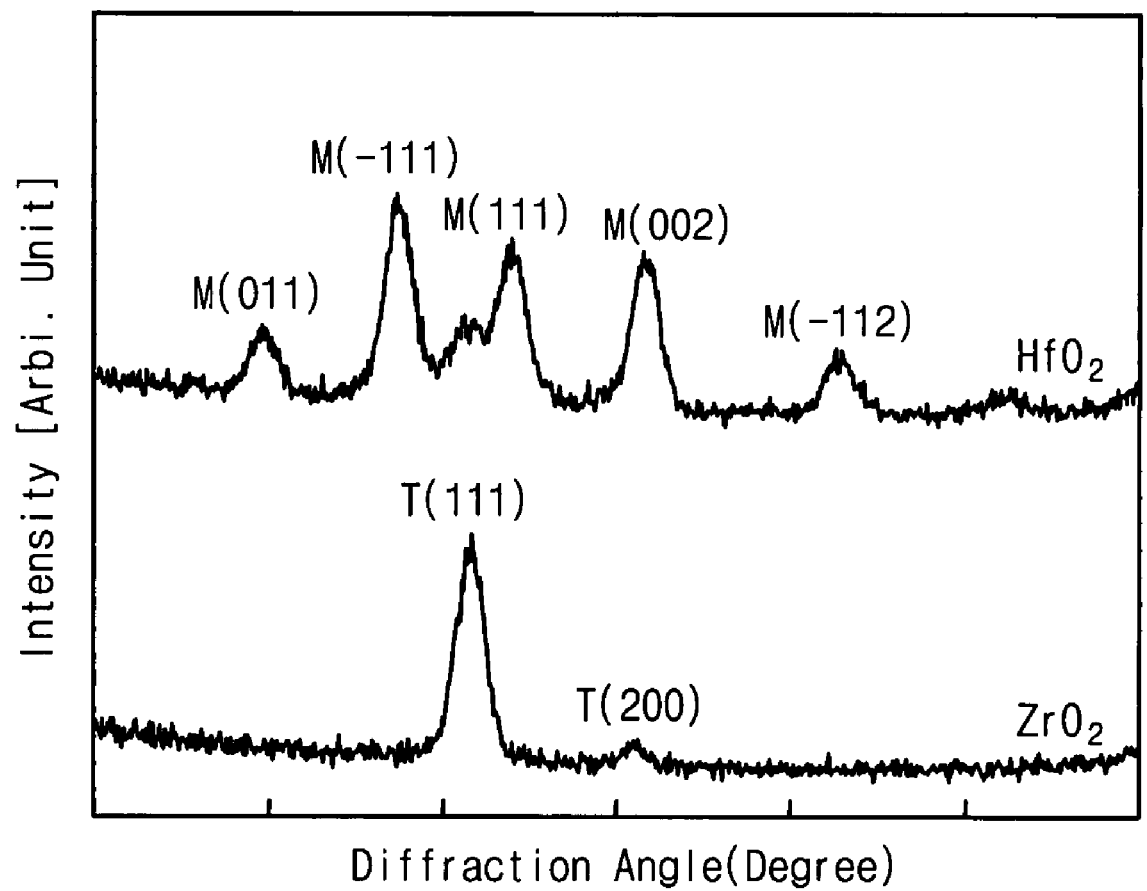
FIGS. 4 and 5 are graphs for illustrating crystalline structures of hafnium oxide, zirconium oxide, and hafnium-zirconium oxide.
Figure 5:
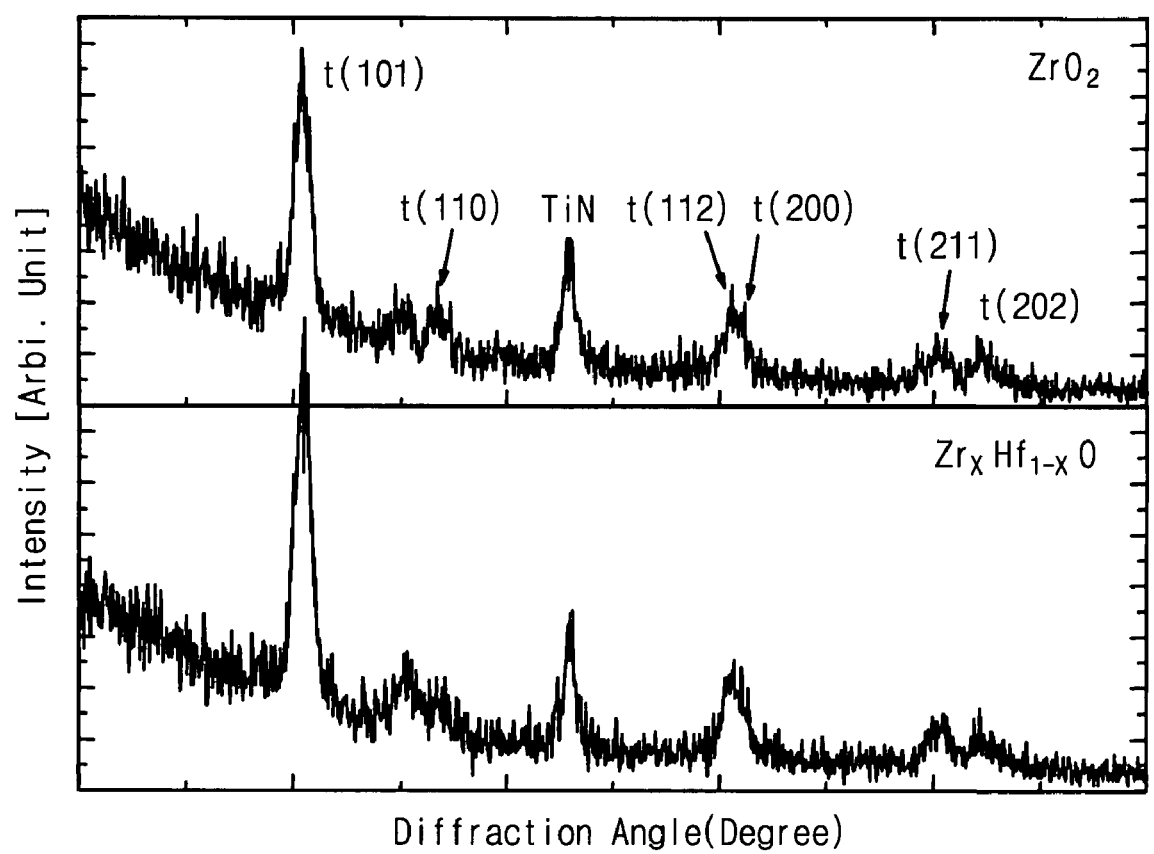

FIGS. 4 and 5 are graphs that illustrate crystalline structures of hafnium oxide, zirconium oxide, and hafnium-zirconium oxide.

Referring to FIGS. 4 and 5, the horizontal axis denotes diffraction angles (Degree) and the vertical axis denotes intensity of peaks. FIG. 4 shows that in the case where a deposition temperature is 300 degrees centigrade or below, hafnium oxide ($HfO_2$) generally has a monoclinic crystalline structure and zirconium oxide ($ZrO_2$) generally has a tetragonal crystalline structure. FIG. 5 shows that a hafnium-zirconium oxide layer formed ($Hf_xZr_{1-x}O$) according to embodiments of the present invention may have a similar tetragonal crystalline structure as zirconium oxide ($ZrO_2$). In FIG. 5, the peak of TiN is seen because a bottom electrode of a capacitor is made of TiN.

Figure 6:
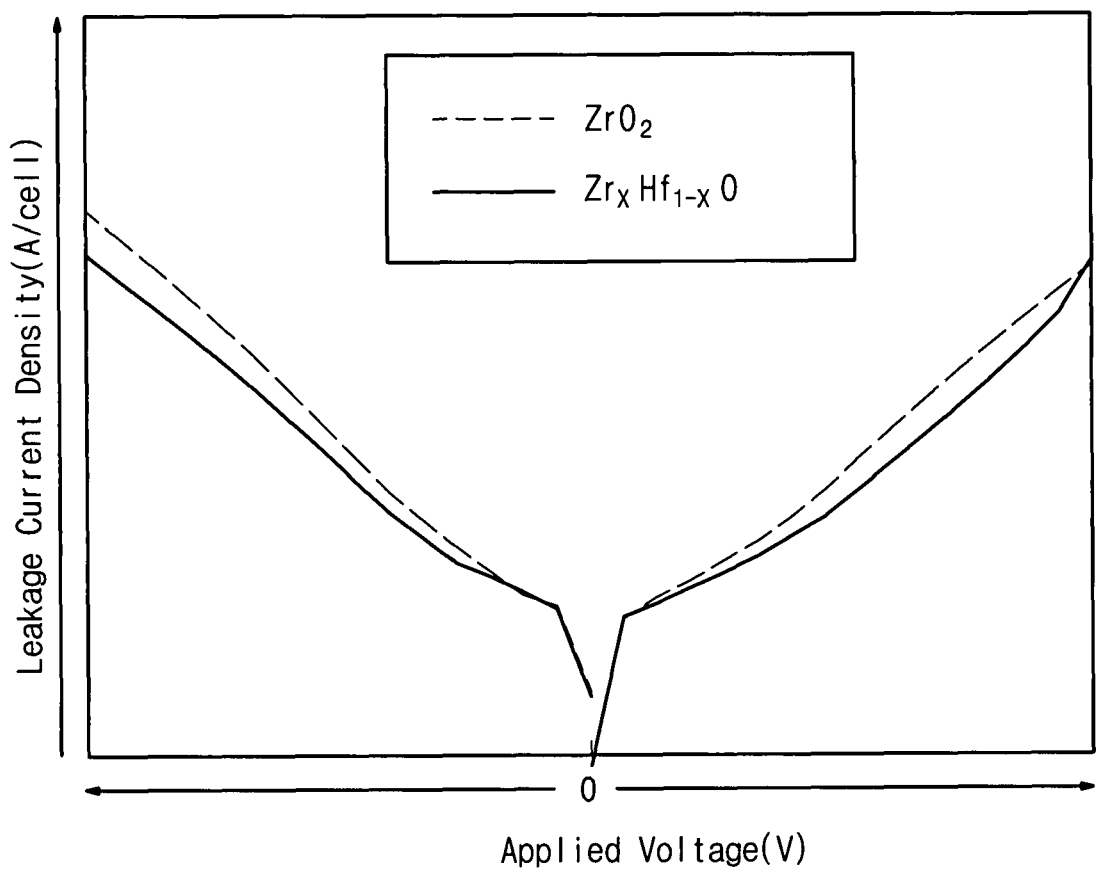
FIG. 6 is a graph for a comparison between leakage current characteristics of zirconium oxide and hafnium-zirconium oxide.

FIG. 6 is a graph that compares leakage current characteristics of zirconium oxide and hafnium-zirconium oxide.

In FIG. 6, the horizontal axis denotes an applied voltage, and the vertical axis denotes a leakage current density. A hafnium-zirconium oxide ($Hf_xZr_{1-x}O$) layer according to some embodiments of the present invention may have the same equivalent oxide thickness and tetragonal crystalline structure as zirconium oxide ($ZrO_2$). The leakage current densities of the hafnium-zirconium oxide and the zirconium oxide are represented by a solid line and a dotted line, respectively. As illustrated in FIG. 6, the leakage current density of the hafnium-zirconium oxide may be lower than that of the zirconium oxide.

As explained above, hafnium-zirconium oxide ($Hf_xZr_{1-x}O$; 0<X<1) having a tetragonal crystalline structure has a high dielectric constant. Further, a capacitor having a dielectric layer including hafnium-zirconium oxide with a tetragonal crystalline structure may exhibit superior leakage current characteristics, which may enhance the reliability of a semiconductor device.

In the drawings and specification, there have been disclosed typical embodiments of the invention and, although specific terms are employed, they are used in a generic and descriptive sense only and not for purposes of limitation, the scope of the invention being set forth in the following claims.

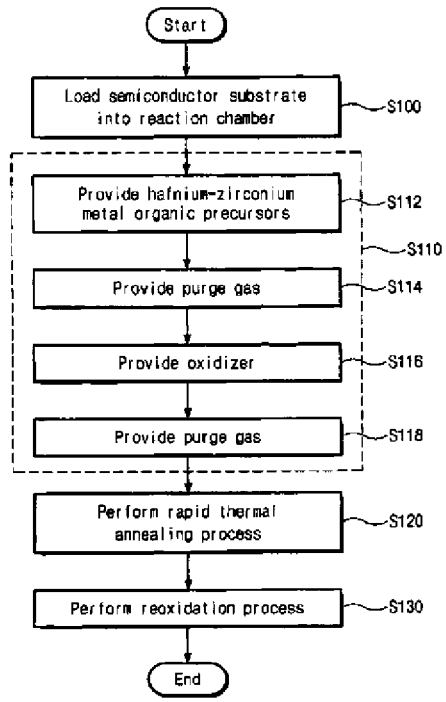

What is claimed is:

1. A method of forming a semiconductor device, comprising:
    loading a semiconductor substrate into a reaction chamber;
    providing metal organic precursors including hafnium and zirconium into the reaction chamber; and
    forming a layer of hafnium-zirconium oxide ($Hf_xZr_{1-x}O$; 0<X<0.5) having a tetragonal crystalline structure on the semiconductor substrate;
    wherein forming the layer of hafnium-zirconium oxide having a tetragonal crystalline structure comprises:
        providing metal organic precursors including hafnium and zirconium into the reaction chamber;
        reacting the metal organic precursors including hafnium and zirconium with an oxidizer to form hafnium-zirconium oxide; and
    crystallizing the hafnium-zirconium oxide to have the tetragonal crystalline structure by performing a rapid thermal annealing process on the semiconductor substrate.

2. The method as set forth in claim 1, wherein the rapid thermal annealing process is performed in a rapid thermal anneal chamber that is different from the reaction chamber.

3. The method as set forth in claim 1, wherein the rapid thermal annealing process is performed at a temperature ranging from about 500 degrees centigrade to about 600 degrees centigrade.

4. The method as set forth in claim 1, further comprising:
    reoxidizing the hafnium-zirconium oxide layer after performing the rapid thermal annealing process.

5. The method as set forth in claim 1, wherein the metal organic precursors comprise tetrakis-ethyl-methyl-amino-hafnium [$Hf(N(CH_3)(C_2H_5))_4$] and tetrakis-ethyl-methyl-amino-zirconium [$Zr(N(CH_3)(C_2H_5))_4$].

6. The method as set forth in claim 1, wherein the semiconductor substrate comprises a bottom electrode; and
    the hafnium-zirconium oxide layer having a tetragonal crystalline structure is formed on the bottom electrode,
    the method further comprising forming a top electrode on the hafnium-zirconium oxide $Hf_xZr_{1-x}O$; 0<X<0.5 layer.

7. The method as set forth in claim 5, wherein a mole ratio of the tetrakis-ethyl-methyl-amino-zirconium [$Zr(N(CH_3)(C_2H_5))_4$] to the tetrakis-ethyl-methyl-amino-hafnium [$Hf(N(CH_3)(C_2H_5))_4$] is 1 or higher.

* * * * *

UNITED STATES PATENT AND TRADEMARK OFFICE
CERTIFICATE OF CORRECTION

| | | |
|---|---|---|
| PATENT NO. | : 7,791,125 B2 | Page 1 of 1 |
| APPLICATION NO. | : 11/881562 | |
| DATED | : September 7, 2010 | |
| INVENTOR(S) | : Im et al. | |

It is certified that error appears in the above-identified patent and that said Letters Patent is hereby corrected as shown below:

On the Title Page:
Item [75] Inventors: Please correct the order of Inventors to read:

Ki-Vin Im, Gyeonggi-do (KR);
    Jae-Hyun Yeo, Gyeonggi-do (KR);
    Hoon-Sang Choi, Seoul (KR)
    Eun-Ae Chung, Seoul (KR);
    Sang-Yeol Kang, Gyeonggi-do (KR)

Signed and Sealed this
Twenty-ninth Day of January, 2013

David J. Kappos
*Director of the United States Patent and Trademark Office*

UNITED STATES PATENT AND TRADEMARK OFFICE
CERTIFICATE OF CORRECTION

PATENT NO. : 7,791,125 B2
APPLICATION NO. : 11/881562
DATED : September 7, 2010
INVENTOR(S) : Lee et al.

It is certified that error appears in the above-identified patent and that said Letters Patent is hereby corrected as shown below:

On the Title Page:
Item [75] Inventors: Please correct the order of Inventors to read:

--Jong-Cheol Lee, Seoul (KR)
Ki-Vin Im, Gyeonggi-do (KR);
Jae-Hyun Yeo, Gyeonggi-do (KR);
Hoon-Sang Choi, Seoul (KR);
Eun-Ae Chung, Seoul (KR);
Sang-Yeol Kang, Gyeonggi-do (KR)-- as shown on the attached Title page.

This certificate supersedes the Certificate of Correction issued January 29, 2013.

Signed and Sealed this
Second Day of April, 2013

Teresa Stanek Rea
*Acting Director of the United States Patent and Trademark Office*

(12) United States Patent
Lee et al.

(10) Patent No.: US 7,791,125 B2
(45) Date of Patent: Sep. 7, 2010

(54) SEMICONDUCTOR DEVICES HAVING DIELECTRIC LAYERS AND METHODS OF FORMING THE SAME

(75) Inventors: Jong-Cheol Lee, Seoul (KR); Ki-Vin Im, Gyeonggi-do (KR); Jae-Hyun Yeo, Gyeonggi-do (KR); Hoon-Sang Choi, Seoul (KR); Eun-Ae Chung, Seoul (KR); Sang-Yeol Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 11/881,562

(22) Filed: Jul. 27, 2007

(65) Prior Publication Data

US 2008/0023746 A1 Jan. 31, 2008

(30) Foreign Application Priority Data

Jul. 31, 2006 (KR) .................. 10-2006-0072206

(51) Int. Cl.
*H01L 27/108* (2006.01)

(52) U.S. Cl. .................... 257/310; 257/E21.009; 438/104

(58) Field of Classification Search .............. 257/310, 257/E21.009; 438/104
See application file for complete search history.

(56) References Cited

U.S. PATENT DOCUMENTS 6,740,605 B1 * 5/2004 Shiraiwa et al. .............. 438/795
2005/0122005 A1 * 6/2005 Higuchi et al. .............. 310/363

FOREIGN PATENT DOCUMENTS

| JP | 2003218107 | 7/2003 |
|----|------------|--------|
| KR | 1020060057037 | 5/2006 |
| KR | 1020060059454 | 6/2006 |

* cited by examiner

*Primary Examiner*—Thao X Le
*Assistant Examiner*—Matthew Gordon
(74) *Attorney, Agent, or Firm*—Myers Bigel Sibley & Sajovec

(57) ABSTRACT

A method of forming a semiconductor device includes loading a semiconductor substrate into a reaction chamber, and providing metal organic precursors including hafnium and zirconium into the reaction chamber to form hafnium-zirconium oxide ($Hf_xZr_{1-x}O$; $0<X<1$) with a tetragonal crystalline structure on the semiconductor substrate. Related structures are also discussed.

7 Claims, 8 Drawing Sheets